United States Patent
Lee et al.

(10) Patent No.: US 11,962,067 B2
(45) Date of Patent: Apr. 16, 2024

(54) ANTENNA CLIP AND ELECTRONIC DEVICE COMPRISING SAME

(71) Applicant: Samsung Electronics Co., Ltd., Gyeonggi-do (KR)

(72) Inventors: Sunghyup Lee, Gyeonggi-do (KR); Yongseok Lee, Gyeonggi-do (KR); Seungki Choi, Gyeonggi-do (KR); Jungsik Park, Gyeonggi-do (KR); Heeseok Jung, Gyeonggi-do (KR); Kyoungho Kim, Gyeonggi-do (KR); Sangmin Kim, Gyeonggi-do (KR); Yongyoun Kim, Gyeonggi-do (KR); Seunghoon Lee, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 492 days.

(21) Appl. No.: 17/253,483

(22) PCT Filed: Jun. 21, 2019

(86) PCT No.: PCT/KR2019/007478
§ 371 (c)(1),
(2) Date: Dec. 17, 2020

(87) PCT Pub. No.: WO2020/004869
PCT Pub. Date: Jan. 2, 2020

(65) Prior Publication Data
US 2021/0184337 A1    Jun. 17, 2021

(30) Foreign Application Priority Data
Jun. 27, 2018   (KR) .................. 10-2018-0073909

(51) Int. Cl.
*H01Q 1/24*   (2006.01)
*H04M 1/02*   (2006.01)
(Continued)

(52) U.S. Cl.
CPC ................ *H01Q 1/24* (2013.01); *H04M 1/02* (2013.01); *H04M 1/0266* (2013.01); *H05K 5/00* (2013.01);
(Continued)

(58) Field of Classification Search
CPC ........ H01Q 1/24; H04M 1/0266; H04M 1/02; H05K 5/0017; H05K 5/00
(Continued)

(56) References Cited

U.S. PATENT DOCUMENTS

2011/0006955 A1   1/2011   Spiess et al.
2011/0136447 A1   6/2011   Pascolini et al.
(Continued)

FOREIGN PATENT DOCUMENTS

CN   104681918   6/2015
JP   201487498   10/2014
(Continued)

OTHER PUBLICATIONS

European Search Report dated Jan. 25, 2023 issued in counterpart application No. 19825296.7-1205, 7 pages.
(Continued)

*Primary Examiner* — Hai V Tran
(74) *Attorney, Agent, or Firm* — The Farrell Law Firm, P.C.

(57) ABSTRACT

An electronic device comprises: a front housing including a display on a front surface; a rear housing located on a rear surface of the front housing; an antenna clip coupled to the rear housing, wherein the antenna clip may comprise: a coupling body coupled to one end of the rear housing; a first contact portion extending from the coupling body and electrically connected to an external radiator, and a second contact portion electrically connected to a circuit board
(Continued)

between the front housing and the rear housing. Other various embodiments may be possible.

20 Claims, 13 Drawing Sheets

(51) Int. Cl.
  *H05K 5/00* (2006.01)
  *H04R 1/04* (2006.01)
(52) U.S. Cl.
  CPC .............. *H05K 5/0017* (2013.01); *H04R 1/04* (2013.01); *H04R 2499/11* (2013.01); *H04R 2499/15* (2013.01)
(58) Field of Classification Search
  USPC .......................................................... 343/702
  See application file for complete search history.

(56) References Cited

U.S. PATENT DOCUMENTS

| | | | |
|---|---|---|---|
| 2014/0118196 A1* | 5/2014 | Koskiniemi | H01Q 21/205 343/702 |
| 2014/0132460 A1 | 5/2014 | Cho et al. | |
| 2015/0062847 A1* | 3/2015 | Park | H05K 3/32 29/832 |
| 2015/0319275 A1 | 11/2015 | Lee et al. | |
| 2016/0056528 A1 | 2/2016 | Yamashita et al. | |
| 2016/0329628 A1* | 11/2016 | Kim | H01Q 1/243 |
| 2016/0352032 A1 | 12/2016 | Park | |
| 2017/0033797 A1 | 2/2017 | Jung et al. | |
| 2017/0047639 A1 | 2/2017 | Lee et al. | |
| 2017/0207516 A1* | 7/2017 | Koo | H04M 1/0249 |
| 2018/0175483 A1 | 6/2018 | Bao et al. | |
| 2019/0074586 A1* | 3/2019 | Ruaro | H01Q 9/04 |
| 2019/0273336 A1 | 9/2019 | Lee et al. | |

FOREIGN PATENT DOCUMENTS

| | | |
|---|---|---|
| KR | 102040061085 | 5/2014 |
| KR | 1020150014293 | 2/2015 |
| KR | 1020150028112 | 3/2015 |
| KR | 1020160127542 | 11/2016 |
| KR | 1020160131696 | 11/2016 |
| KR | 101731037 | 4/2017 |
| KR | 1020180037791 | 4/2018 |

OTHER PUBLICATIONS

Korean Office Action dated Oct. 18, 2022 issued in counterpart application No. 10-2018-0073909, 11 pages.
PCT/ISA/210 Search Report issued on PCT/KR2019/007478, dated Sep. 27, 2019, pp. 5.
PCT/ISA/237 Written Opinion issued on PCT/KR2019/007478, dated Sep. 27, 2019, pp. 7.
European Search Report dated Jun. 29, 2021 issued in counterpart application No. 19825296.7-1205, 10 pages.
Chinese Office Action dated Dec. 12, 2023 issued in counterpart application No. 201980043282.4, 16 pages.

* cited by examiner

ANTENNA CLIP AND ELECTRONIC DEVICE COMPRISING SAME

PRIORITY

This application is a National Phase Entry of PCT International Application No. PCT/KR2019/007478 which was filed on Jun. 21, 2019, and claims priority to Korean Patent Application No. 10-2018-0073909, which was filed on Jun. 27, 2018, the content of each of which is incorporated herein by reference.

TECHNICAL FIELD

Various embodiments of the disclosure relate to an antenna clip and an electronic device including the same.

BACKGROUND ART

Rapid development of communication technologies has been followed by development of electronic devices providing communication services in various bands, such as long term evolution (LTE), global positioning system (GPS), near field communication (NFC), or wireless LNA (WLAN).

Such an electronic device is equipped with an antenna capable of transmitting/receiving radio signals. Antennas may be classified into external antennas and embedded antennas according to antenna disposition. The embedded antennas have recently been highly preferred due to requirements regarding durability and exterior design.

In addition, electronic devices are increasingly made slim, and displays have come to occupy the majority of the front surface of electronic devices. In line with such a trend, various studies have been conducted to highly integrate internal components while maintaining the radiation performance of antennas.

DISCLOSURE OF INVENTION

Technical Problem

Electronic devices, the performance and function of which have become diversified, may accordingly have various electronic components embedded therein. Since the space of each electronic device is limited, electronic components may be disposed more and more tightly and thus may affect the performance of each other during operating processes. For example, the smaller the distance between an antenna and a display, the larger influence the display may have on the radiation performance of the antenna.

An antenna clip and an electronic device according to various embodiments of the disclosure may reduce the degree of absorption, into a display, of a radiation signal delivered from a main antenna to an external radiator.

Solution to Problem

An electronic device according to an embodiment of the disclosure may include: a front housing including a display on the front surface thereof; a rear housing located on the rear surface of the front housing; and an antenna clip coupled to the rear housing. The antenna clip may include: a coupling body coupled to one end of the rear housing; a first contact portion extending from the coupling body and electrically connected to an external radiator; and a second contact portion electrically connected to a circuit board disposed between the front housing and the rear housing.

An antenna clip according to an embodiment of the disclosure may include: a coupling body coupled to one end of a rear housing of an electronic device; a first contact portion extending from the coupling body and electrically connected to an external radiator; a second contact portion electrically connected to a circuit board disposed between the front housing of the electronic device and the rear housing; and a third contact portion disposed at a portion of the coupling body and electrically connected to the rear housing.

Advantageous Effects of Invention

According to exemplary embodiments of the disclosure, the flange of the external radiator and the circuit board on which the main antenna is disposed may be spaced apart from each other to the largest extent in the thickness direction of the electronic device, thereby minimizing absorption of radiation signals from the antenna into the display.

MODE FOR THE INVENTION

Figure 1:
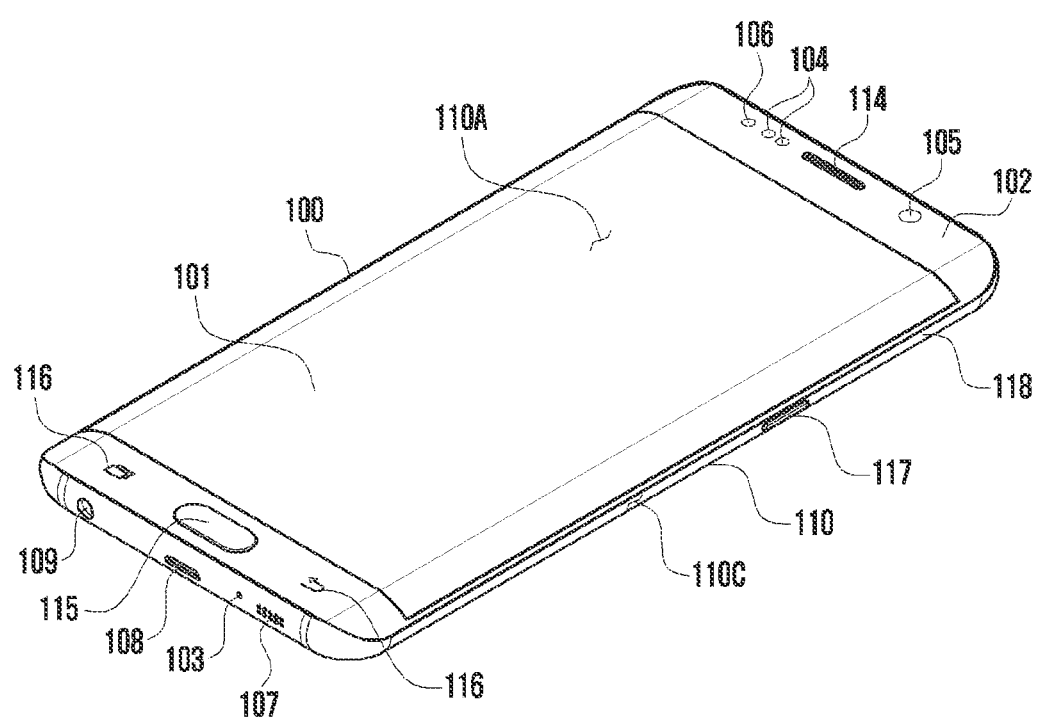
FIG. 1 is a perspective view of a front surface of a mobile electronic device according to an embodiment.
Figure 2:
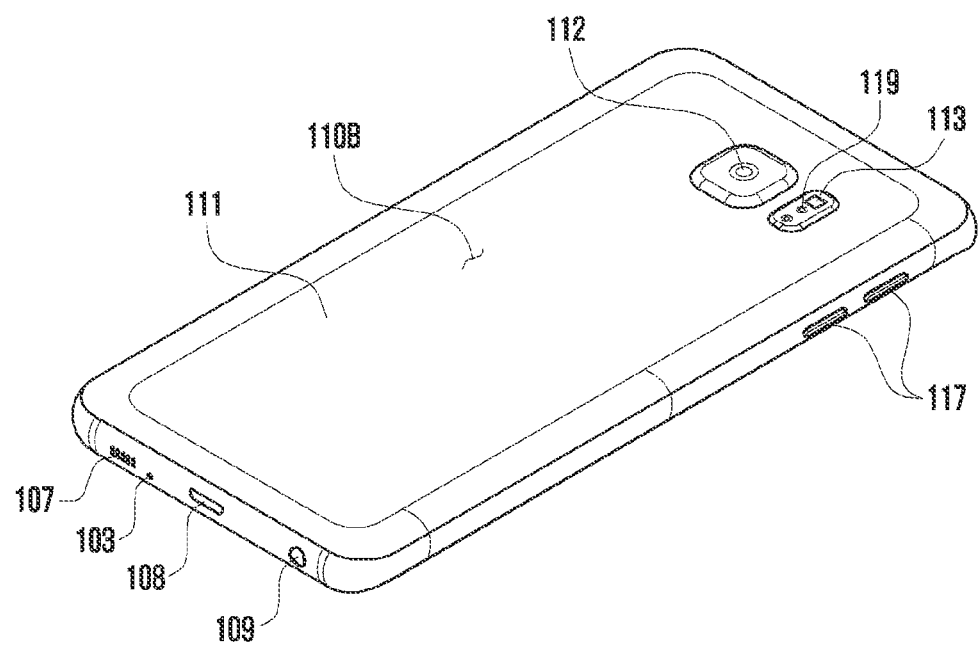
FIG. 2 is a perspective view of a rear surface of the electronic device of FIG. 1.

Referring to FIGS. 1 and 2, according to an embodiment, an electronic device 100 may include a housing 110 that includes a first surface (or front surface) 110A, a second surface (or rear surface) 1110B, and a lateral surface 110C that surrounds a space between the first surface 110A and the second surface 110B. According to another embodiment, the housing 110 may refer to a structure that forms a part of the first surface 110A, the second surface 110B, and the lateral surface 110C. According to an embodiment, the first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material such as aluminum).

According to an embodiment, the electronic device 100 may include at least one of a display 101, audio modules 103, 107 and 114, sensor modules 104, and 119, camera modules 105, 112 and 113, key input devices 115, 116 and 117, indicator 106, and connector holes 108 and 109. In various embodiments, the electronic device 100 may omit at least one (e.g., the key input devices 115, 116 and 117 or the indicator 106 of the above components, or may further include other components.

The display 101 may be exposed through a substantial portion of the front plate 102, for example. The display 101 may be combined with, or adjacent to, a touch sensing circuit, a pressure sensor capable of measuring the touch strength (pressure), and/or a digitizer for detecting a stylus pen.

The audio modules 103, 107 and 114 may correspond to a microphone hole 103 and speaker holes 107 and 114. The microphone hole 103 may contain a microphone disposed therein for acquiring external sounds and, in a case, contain a plurality of microphones to sense a sound direction. The speaker holes 107 and 114 may be classified into an external speaker hole and a call receiver hole. In various embodiments, the microphone hole 103 and the speaker holes 107 and 114 may be implemented as a single hole, or a speaker (e.g., a piezo speaker) may be provided without the speaker holes 107 and 114.

The sensor modules 104 and 119 may generate electrical signals or data corresponding to an internal operating state of the electronic device 100 or to an external environmental condition. The sensor modules 104 and 119 may include a first sensor module 104 (e.g., a proximity sensor) and/or a second sensor module (not shown) (e.g., a fingerprint sensor) disposed on the first surface 110A of the housing 110, and/or a third sensor module 119 (e.g., a heart rate monitor (HRM) sensor) disposed on the second surface 110B of the housing 110. The fingerprint sensor may be disposed on the second surface 110B as well as the first surface 110A (e.g., home key button 115) of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor 104.

The camera modules 105, 112 and 113 may include a first camera device (e.g., the camera module 105) disposed on the first surface 110A of the electronic device 100, and a second camera device (e.g., the camera module 112) and/or a flash (e.g., the camera module 113) disposed on the second surface 110B. The camera module 105 or the camera module 112 may include one or more lenses, an image sensor, and/or an image signal processor. The flash may include, for example, a light emitting diode or a xenon lamp. In various embodiments, two or more lenses (infrared cameras, wide angle and telephoto lenses) and image sensors may be disposed on one side of the electronic device 100.

The key input devices 115, 116 and 117 may include home key button(115) disposed on the first surface 110A of the housing 110, touch pad 116 disposed adjacent to the home key button 115 and/or side key button 117 disposed on the lateral surface 1100. In another embodiment, the electronic device 100 may not include some or all of the key input devices 115, 116 and 117 described above, and the key input devices 117 which are not included may be implemented in another form such as a soft key on the display 101.

The indicator 106 may be disposed on the first surface 110A of the housing 110, for example. For example, the indicator 106 may provide status information of the electronic device 100 in an optical form and include a light emitting diode (LED).

The connector holes 108 and 109 may include a first connector hole (e.g., the connector hole 108) adapted for a connector (e.g., a universal serial bus (USB) connector) for transmitting and receiving power and/or data to and from an external electronic device, and/or a second connector hole (e.g., the connector hole 109) adapted for a connector e.g., an earphone jack) for transmitting and receiving an audio signal to and from an external electronic device.

Figure 3:
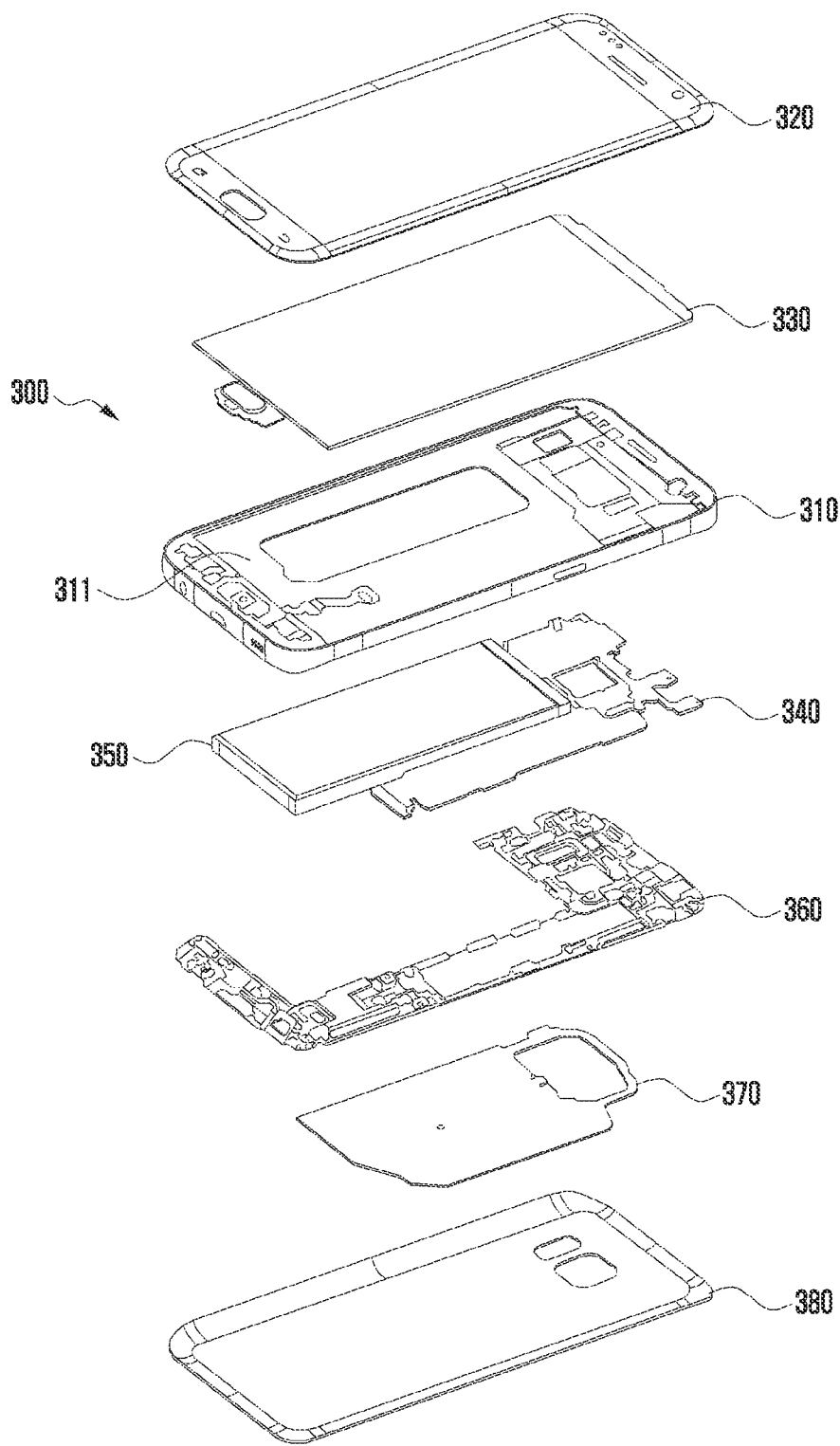
FIG. 3 is an exploded perspective view of the electronic device of FIG. 1.

Referring to FIG. 3, an electronic device 300 (e.g., the electronic device 100 of FIG. 1) may include a lateral bezel structure 310, a first support member 311 (e.g., a bracket), a front plate 320, a display 330 (e.g., the display 101), a printed circuit board (PCB) 340, a battery 350, a second support member 360 (e.g., a rear case), an antenna 370, and a rear plate 380. In various embodiments, the electronic device 300 may omit at least one (e.g., the first support member 311 or the second support member 360) of the above components or may further include another component, Some components of the electronic device 300 may be the same as or similar to those of the electronic device 100 shown in FIG. 1 or FIG. 2, thus, descriptions thereof are omitted below.

The first support member 311 is disposed inside the electronic device 300 and may be connected to, or integrated with, the lateral bezel structure 310, The first support member 311 may be formed of, for example, a metallic material and/or a non-metal (e.g., polymer) material. The first support member 311 may be combined with the display 330 at one side thereof and also combined with the PCB 340 at the other side thereof. On the PCB 340, a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

The memory may include, for example, volatile memory or non-volatile memory.

The interface may include, for example, a high definition multimedia interface (HDMI), a USB interface, a secure digital (SD) card interface, and/or an audio interface. The interface may electrically or physically connect the electronic device 300 with an external electronic device and may include a USB connector, an SD card/multimedia card (MMC) connector, or an audio connector.

The battery 350 is a device for supplying power to at least one component of the electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the electronic device 300, and may be detachably disposed from the electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral bezel structure 310 and/or the first support member 311.

Figure 4A:
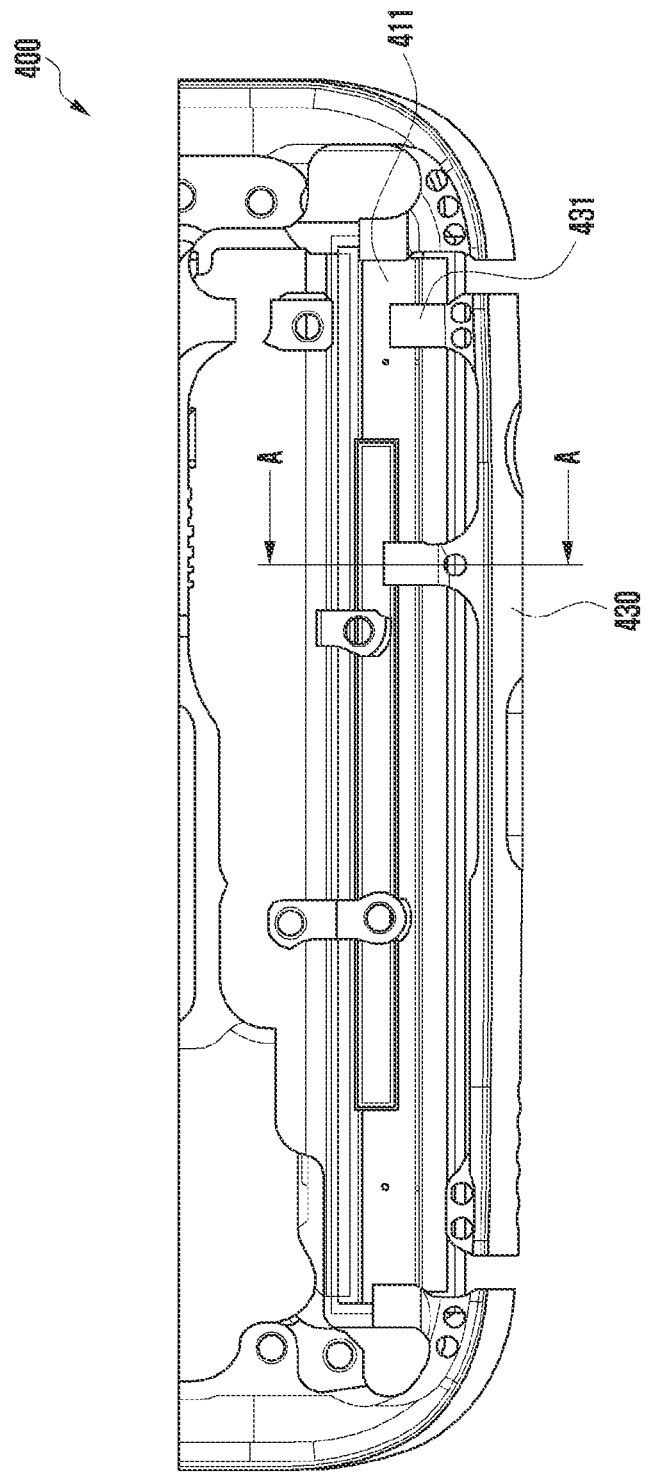
FIGS. 4A and 4B are views mainly illustrating locations of an external radiator and an antenna clip of an electronic device according to an embodiment of the disclosure.
Figure 4B:
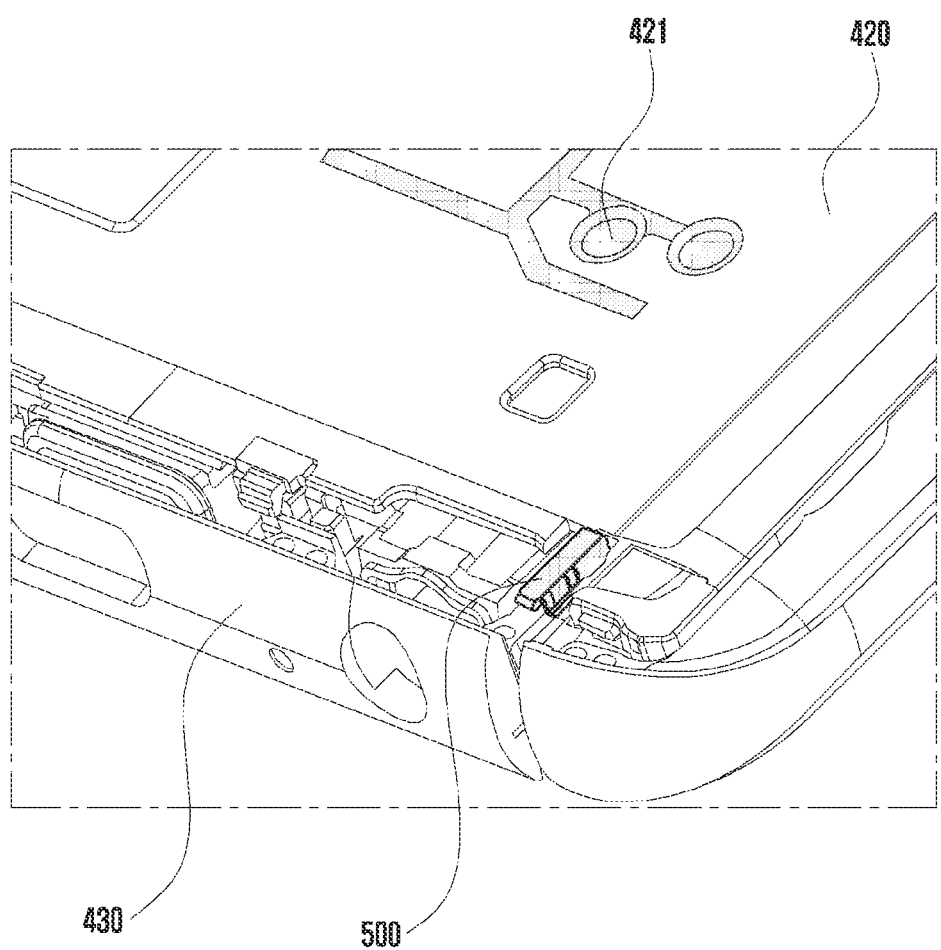

FIGS. 4A and 4B are views mainly illustrating locations of an external radiator 430 and an antenna clip 500 of an electronic device 400 according to an embodiment of the disclosure.

In detail, FIG. 4A is a view mainly illustrating locations of an external radiator 430, a flange 431, and a display 411 of the electronic device 400 according to the embodiment of the disclosure, and FIG. 4B is a view mainly illustrating locations of a rear housing 420, and a sub-antenna 421 and an antenna clip 500 disposed in the rear housing 420.

FIG. 4A may illustrate a portion of an upper end or a lower end of the electronic device 400 according to the embodiment, and may illustrate portions, at which an antenna-related module and the external radiator 430 connected thereto are mainly located.

The external radiator 430 may be a main metal frame surrounding an outermost side of the electronic device 400. The external radiator 430 may include a flange 431 protruding to the inside of the electronic device 400, and may receive a radiation signal from the electronic device 400 (e.g., a processor) through the flange 431. According to an embodiment, the external radiator 430 may include a unit conductive part disposed through a pair of at least partially spaced nonconductive parts of a conductive side member (e.g., a side bezel structure) of the electronic device 400. The conductive part may be disposed to be viewed from the outside as a portion of the side member. In recent years, because the area of the electronic device 400, which is occupied by a display 411 on a front surface thereof, has gradually become wider to occupy most of the front surface, a gap between an outermost metal frame 430 and the display 411 may become very narrow as illustrated in FIG. 4A. Accordingly, an overlapping portion may be disposed between the flange 431 of the metal frame 430 and the display 411.

A radiation signal that has to be delivered to the external radiator 430 may fail to be delivered to an overlapping portion of the flange 431 and the display 411 and may be absorbed by the display 411, and thus the radiation performance of the antenna may be influenced. Accordingly, it is best to dispose the display 411 and the flange 431 such that they do not overlap each other, but because the display 411 occupies most of the front surface of the electronic device, it may be difficult to secure a wide gap such that the metal frame 430 and the display 411 do not overlap each other.

According to various embodiments of the disclosure, the gap between the flange 431 and the display 411, when the display is viewed from the top, that is, in the thickness of the electronic device 400, is to be secured by maximizing the gap. Detailed items will be described with reference to the cross-sectional view of FIG. 5.

FIG. 4B may illustrate a rear housing 420 of the electronic device 400 according to an embodiment of the disclosure, and a sub-antenna 421 disposed in the rear housing 420.

The sub-antenna 421 disposed in the rear housing 420 may include at least one conductive pattern disposed in the rear housing 420 in a laser direct structuring (LDS) scheme.

The sub-antenna 421 according to an embodiment of the disclosure may be electrically connected to a main antenna and/or a wireless communication circuit and an external radiator 430 disposed in the circuit board 440 (see FIG. 5) in the electronic device 400 through the antenna clip 500. The sub-antenna 421 may adjust the frequency of a radiation signal generated by the main antenna. For example, the differences of communication frequencies used in nations may be adjusted and solved through the sub-antenna 421.

Figure 5:
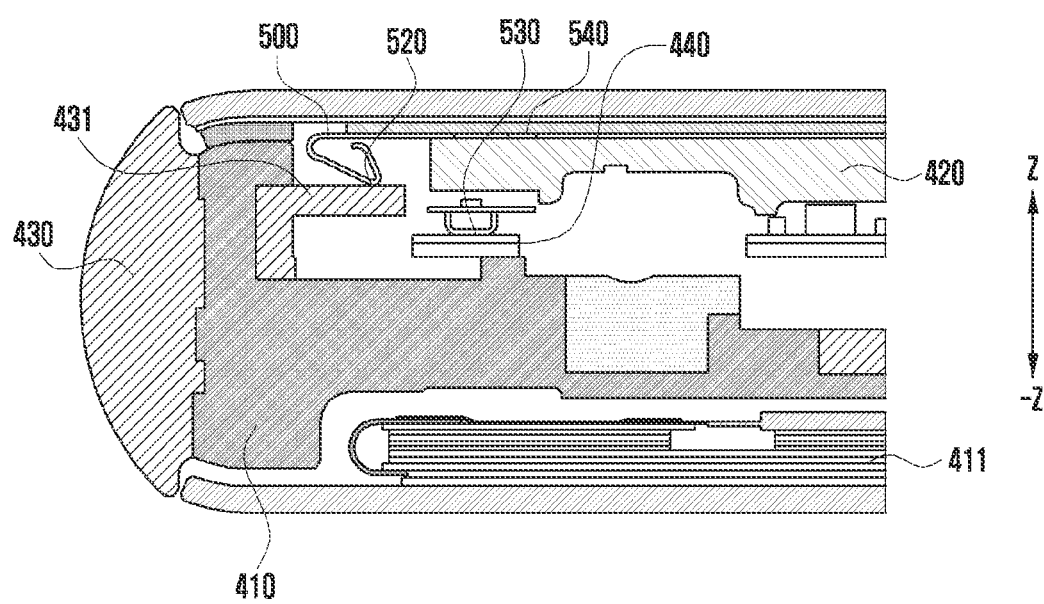
FIG. 5 is a cross-sectional view taken along line A-A of FIG. 4A.

FIG. 5 is a cross-sectional view taken along line A-A of FIG. 4A.

The electronic device 400 according to an embodiment of the disclosure may include a front housing 410, a rear housing 420, and an antenna clip 500.

The front housing 410 according to an embodiment may form an overall frame in the interior of the electronic device 400, and may include the display 411 on the front surface of the electronic device 400. The front housing 410 may be manufactured through injection-molding based on a plastic material, but the disclosure is not limited thereto.

The rear housing 420 according to an embodiment of the disclosure may be disposed on a rear surface of the front housing 410. Various electronic components, including the circuit board 440, may be disposed between the front housing 410 and the rear housing 420. For example, the circuit board 440, in which the main antenna and/or the wireless communication circuit of the disclosure are embedded, may be disposed. The rear housing 420 may function to protect the electronic components in the interior of the electronic device 400 such that the electronic components are not directly exposed. The above-mentioned sub-antenna 421 (see FIG. 4B) may be engraved in the rear housing 420, and may be electrically connected to the antenna clip 500. In another embodiment, the sub-antenna 421 may be disposed in various structures (e.g., an antenna carrier) disposed at proper sites of the interior of the electronic device instead of in the rear housing.

The antenna clip 500 according to an embodiment of the disclosure may include a coupling body 510 (see FIG. 6A) that is to be coupled to the rear housing 420, a first contact portion 520 that is to be electrically connected to the external radiator 430, a second contact portion 530 that is to be electrically connected to the main antenna disposed in the circuit board 440, and a third contact portion 540 that is to be electrically connected to the sub-antenna of the rear housing 420. The detailed shape of the antenna clip 500 will be discussed with reference to FIGS. 6 to 8 together.

The antenna clip 500 according to an embodiment of the disclosure may electrically connect the main antenna, the sub-antenna, and the external radiator 430 through the first to third contact portions 520 to 540 while the antenna clip 500 is disposed at a height that is the same as or similar to the height of the rear housing 420 with reference to the illustrated state of FIG. 5. Through this, the height of the circuit board 440, in which the flange 431 of the external radiator 430, the main antenna, and/or the wireless communication circuit is disposed, may be made to maximally high, and the interval from the display 411 may be maximized so that the radiation signal may be prevented from being absorbed by the display 411.

Although it is necessary to increase the height of the circuit board 440 up to a height that is similar to the height of the flange 431 in order to maximize the interval between the circuit board 440 and the display 411, it may be difficult to increase the height of the circuit board 440 up to the same height as the flange 431 in consideration of the operation height of the second contact portion 530 and the thickness of the rear housing 420 that fixes the third contact portion 540.

Accordingly, even though the height of the circuit board 440 cannot be increased up to the same height as the flange 431, an area in which the flange 431, in which the radiation of the external radiator 430 is started, and the circuit board 440 overlap each other in the z-axis direction is not present, such that the flange 431 is coupled to the circuit board 440 when the external radiator 43 is radiated, whereby the radiation efficiency of the external radiator 430 may be prevented from being decreased.

Further, the second contact portion 530 of the antenna clip 500, which receives a radiation signal from the main antenna, may contact an upper surface (with reference to the z-axis direction) of the circuit board 440 with reference to the illustrated state of FIG. 5, and the first contact portion 520 that delivers a radiation signal from the antenna clip 500 to the external radiator 430 may contact an upper surface (the z-axis direction) of the flange 431 such that the display 411 and the flange 431 may be maximally spaced apart from each other with respect to the z-axis direction.

Figure 6A:
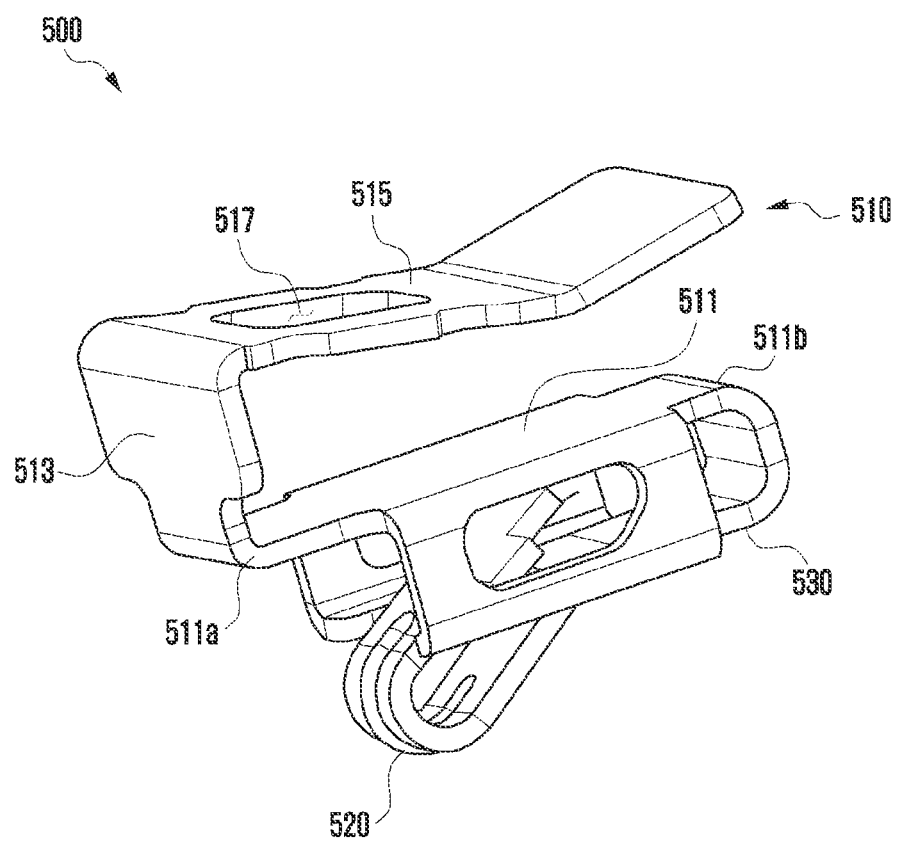
FIGS. 6A and 6B are views illustrating an antenna clip according to an embodiment, at various angles.
Figure 6B:
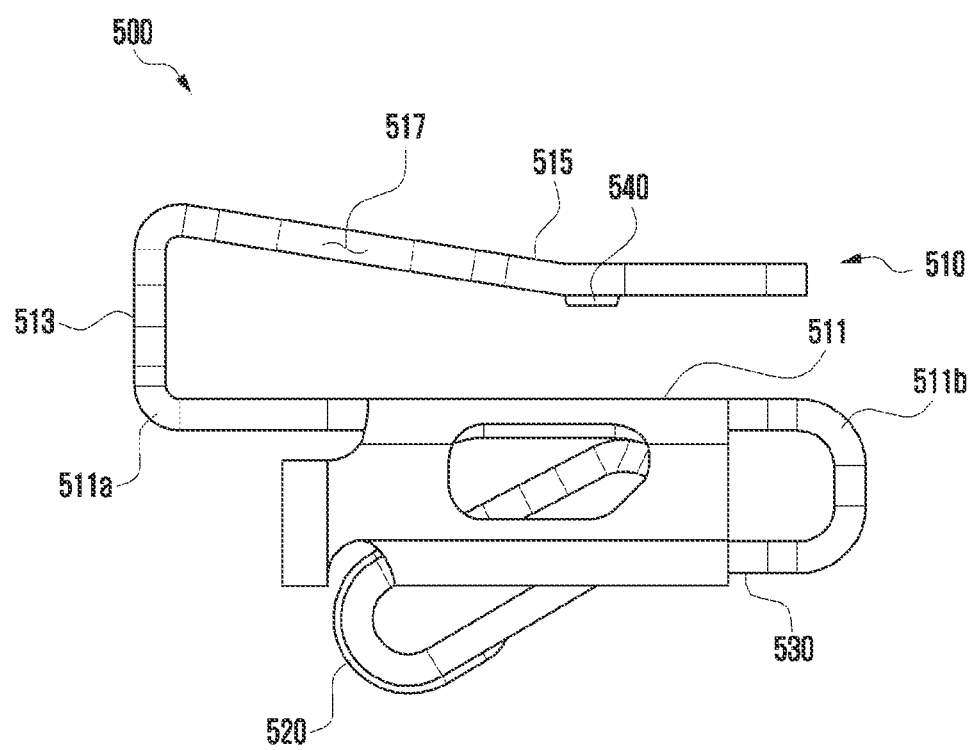

FIGS. 6A and 6B are views illustrating an antenna clip 500 according to an embodiment, at various angles.

FIG. 6A is a perspective view of the antenna clip 500 according to the embodiment of the disclosure, and FIG. 6B is a side view of the antenna clip 500 according to the embodiment of the disclosure.

Referring to FIGS. 6A and 6B, the antenna clip 500 according to an embodiment of the disclosure may include a coupling body 510 that is to be coupled to the rear housing 420 (see FIG. 5), a first contact portion 520 that is to be electrically connected to the external radiator 430 (see FIG. 5), a second contact portion 530 that is to be electrically connected to the main antenna disposed in the circuit board 440 (see FIG. 5), and a third contact portion 540 that is to be electrically connected to the sub-antenna 421 (see FIG. 4B) of the rear housing.

The coupling body 510 according to the embodiment of the disclosure may include a base plate 511, a first plate 513, and a second plate 515. The base plate 511 may have a substantially rectangular shape, and may extend from the corners 511a and 511b of a short side thereof to form a first plate 513 and a second plate 515.

In a description of the antenna clip 500 according to various embodiments of the disclosure, the left side of the base plate 511 will be referred to as a first direction, the tight side of the base plate 511 will be referred to as a second direction, and the upper side of the base plate 551 will be referred to as one side direction, and the lower side of the base plate 511 will be referred to as an opposite side with reference to the illustrated state of FIG. 6A or FIG. 6B.

To help the understanding of the disclosure, terms, such as the first direction, the second direction, the one side direction, and the opposite side direction, are used, but they are relative terms, and if one direction is changed, the remaining directions may be also changed in correspondence to the change.

The first plate 513 according to the embodiment of the disclosure may extend from the first direction corner 511a of the base plate 511 and be bent upwards, and the second plate 515 may extend from the first plate 513 and be bent to face the base plate 511. The bending angles of the first plate 513 and the second plate 515 are preferably 90 degrees, but may be changed if necessary.

The length of the first plate 513 according to the embodiment of the disclosure may be formed to correspond to the thickness of the rear housing, to which the antenna clip 500 is to be coupled. The second plate 515 may be disposed to face the base plate 511, but both the plates do not need to be disposed in parallel to each other, and the interval between the second plate 515 and the base plate 511 may be made to become gradually narrower as it extends from the first plate 513. If the antenna clip 500 is mounted on the rear housing in a state in which the interval between the second plate 515 and the base plate 511 is narrow, it grips the rear housing like a nipper by an elastic fore generated while the first plate 515 and the second plate 515 are deformed, whereby the antenna clip 500 may be coupled to the rear housing.

The base plate 511 or the second plate 515 according to the embodiment of the disclosure may have a coupling hole 517 that passes through the base plate 511 or the second plate 515. If a coupling boss is disposed in the rear housing to correspond to the location of the coupling hole 517, the coupling hole 517 and the coupling boss are coupled to each other whereby the antenna clip 500 may be coupled to the rear housing more firmly when the antenna clip 500 is coupled to the rear housing.

The first contact portion 520 according to the embodiment of the disclosure may extend from the second direction corner 511b of the base plate 511 and be bent in an opposite direction a plurality of times. The first contact portion 520 may be deformed in a direction or an opposite direction to provide an elastic force. For example, the first contact portion 520 may be made to be maintained while contacts points of the first contact portion 520 and the flange 431 (see FIG. 5) are not separated from each other, by applying an elastic force to a contact surface of the first contact portion 520 with the flange 431 (see FIG. 5). Through this, the antenna clip 500 and the external radiator 430 (see FIG. 5) may be electrically connected to each other.

The second contact portion 520 according to the embodiment of the disclosure may be disposed at a predetermined location between the second direction corner 511b of the base plate 511 and the first contact portion 520. For example, the second contact portion 520 may be disposed at a location obtained by bending the second contact portion 520 once from the second direction corner 511b of the base plate 511 with reference to FIG. 6B, and may be disposed at location obtained by bending the second contact portion 520 twice. That is, the second contact portion 530 may be disposed at a predetermined location between the second direction corner 511b of the base plate 511 and the first contact portion 520 to electrically connect the antenna clip 500 and the main antenna of the circuit board according to an arrangement situation of the circuit board disposed in the interior of the electronic device.

The third contact portion 540 according to the embodiment of the disclosure may be disposed on a surface of the base plate 511 or the second plate 515, which contacts the rear housing. For example, as illustrated in FIG. 6A or FIG. 6B, the third contact portion 540 may be disposed in the second plate 515. Through this, the antenna clip 500 may be electrically connected to the sub-antenna of the rear housing.

Figure 7A:
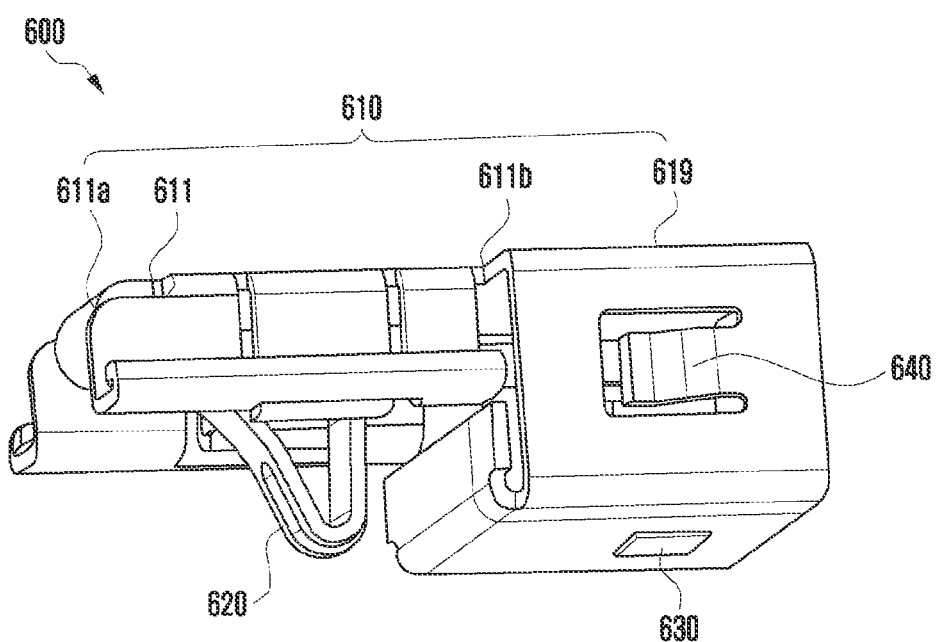
FIGS. 7A, 7B, and 7C are views illustrating an antenna clip according to another embodiment, at various angles.
Figure 7B:
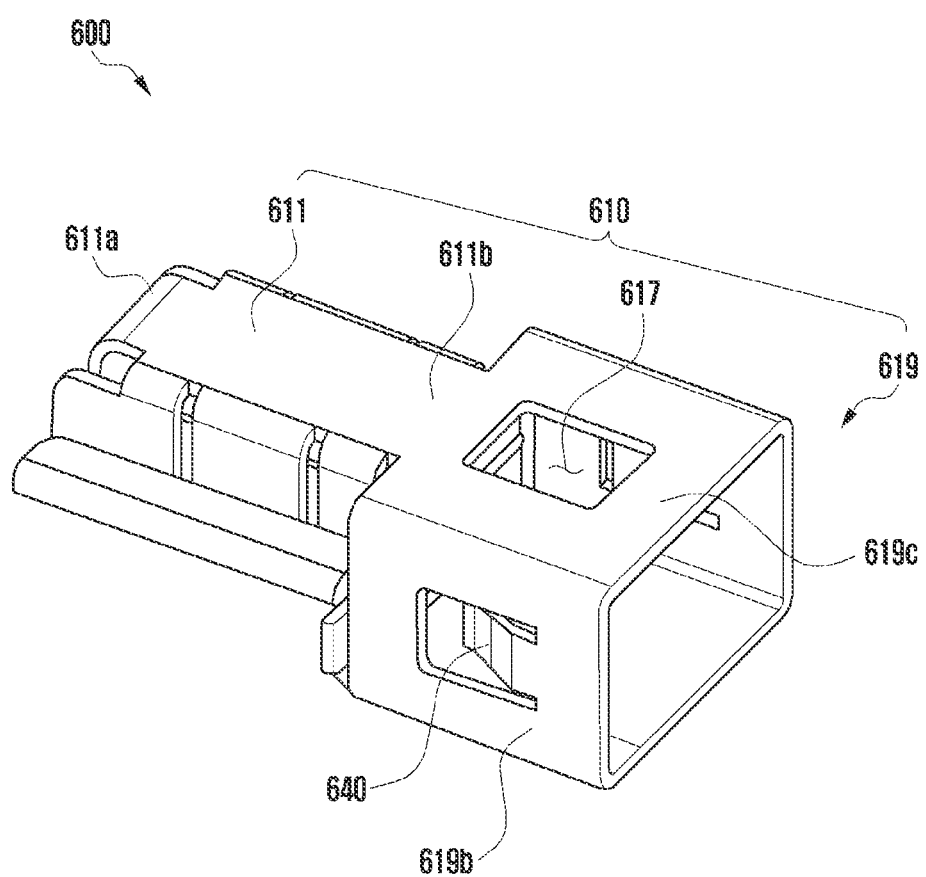
Figure 7C:
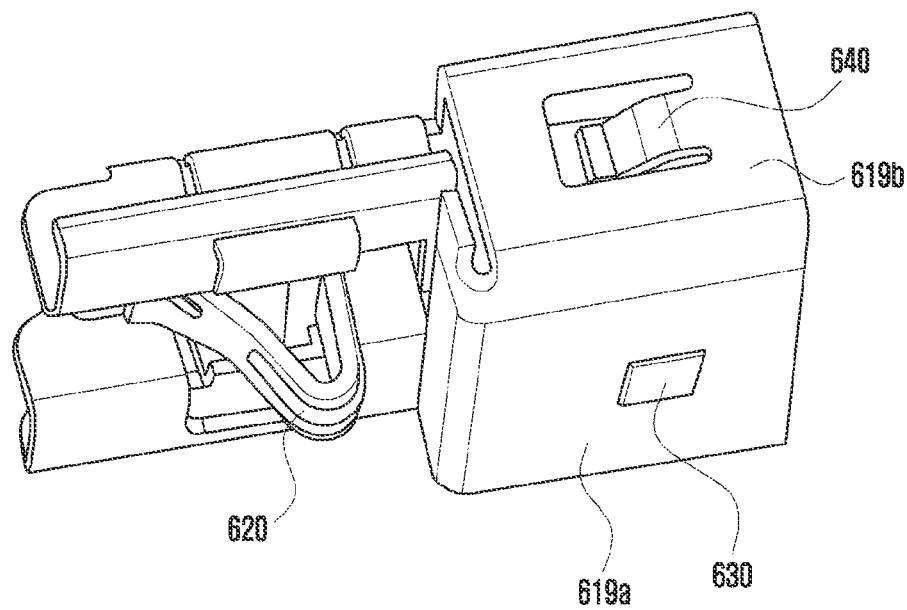

FIGS. 7A and 7B are views illustrating an antenna dip 600 according to another embodiment, at various angles.

In a description of the electronic device and the antenna clip 600 according to various embodiments of the disclosure, the same elements are denoted by similar reference numerals (e.g., 520, 620, and 720) of the embodiment of FIGS. 6A to 6B, and a description thereof will be omitted and differences thereof will be mainly described.

Referring to FIGS. 7A and 7B, the antenna clip 600 according to the another embodiment of the disclosure may include a coupling body 610 that is to be coupled to the rear housing 420 (see FIG. 5), a first contact portion 620 that is to be electrically connected to the external radiator 430 (see FIG. 5), a second contact portion 630 that is to be electrically connected to the main antenna disposed in the circuit board 440 (see FIG. 5), and a third contact portion 640 that is to be electrically connected to the sub-antenna 431 (see FIG. 4B) of the rear housing.

The coupling body 610 according to the embodiment of the disclosure may include a base plate 611 and a coupling portion 619. The base plate 611 may have a substantially rectangular shape, and coupling portions 619 may be disposed at corners 611a and 611b of a short side thereof.

The coupling portion 619 according to the embodiment of the disclosure may be a box-shaped structure connected to the second direction corner 611b of the base plate 611, and may have a shape having an opened second direction surface. The opened surface of the coupling portion 619 may be mounted on the rear housing such that the antenna clip 600 is coupled to the rear housing.

The coupling portion 619 according to the embodiment of the disclosure may have a second contact portion 630, a third contact portion 640, and a coupling hole 617 on the surfaces, except for a surface of the coupling portion 619, which is coupled to the second direction corner 611b of the base plate 611, and the opened surface of the coupling portion 619.

For example, the second contact portion 630 may be disposed on a first surface 619a, among a plurality of surfaces of the coupling portion 619, and may be disposed on a bottom surface of the coupling portion 619 with reference to FIG. 7A. Through this, the antenna clip 600 and the main antenna of the circuit board may be electrically connected to each other.

The third contact portion 640 according to the embodiment of the disclosure may be disposed on a second surface 619b, among the plurality of surfaces of the coupling portion 619. The third contact portion 640 may have a shape, in which a portion of the second surface 619b is cut away and is bent to the inner space of the coupling portion 619. The third contact portion 640 may be interfered with the rear housing when the rear housing is inserted through the opened surface of the coupling portion 619, and the third contact portion 640 may be elastically deformed to press the rear housing. Through this, the contact state of the sub-antenna of the rear housing and the third contact portion 640 may be firmly maintained, and the antenna clip 600 may be electrically connected to the sub-antenna of the rear housing.

The coupling hole 617 according to the embodiment of the disclosure may pass through a third surface 619c, among the plurality of surfaces of the coupling portion 619. If a coupling boss is disposed in the rear housing to correspond to the location of the coupling hole 617, the coupling hole 617 and the coupling boss are coupled to each other whereby the antenna clip 600 may be coupled to the rear housing more firmly when the antenna dip 600 is coupled to the rear housing.

The first contact portion 620 according to the embodiment of the disclosure may extend from the first direction corner of the base plate 611 and be bent in an opposite direction a plurality of times. The first contact portion 620 may be deformed in a direction or an opposite direction to provide an elastic force. For example, the first contact portion 620 may be made to be maintained while contacts points of the first contact portion 520 and the flange 431 (see FIG. 5) are not separated from each other, by applying an elastic force to a contact surface of the first contact portion 520 with the flange 431 (see FIG. 5). Through this, the antenna clip 600 and the external radiator 430 (see FIG. 5) may be electrically connected to each other.

Figure 8A:
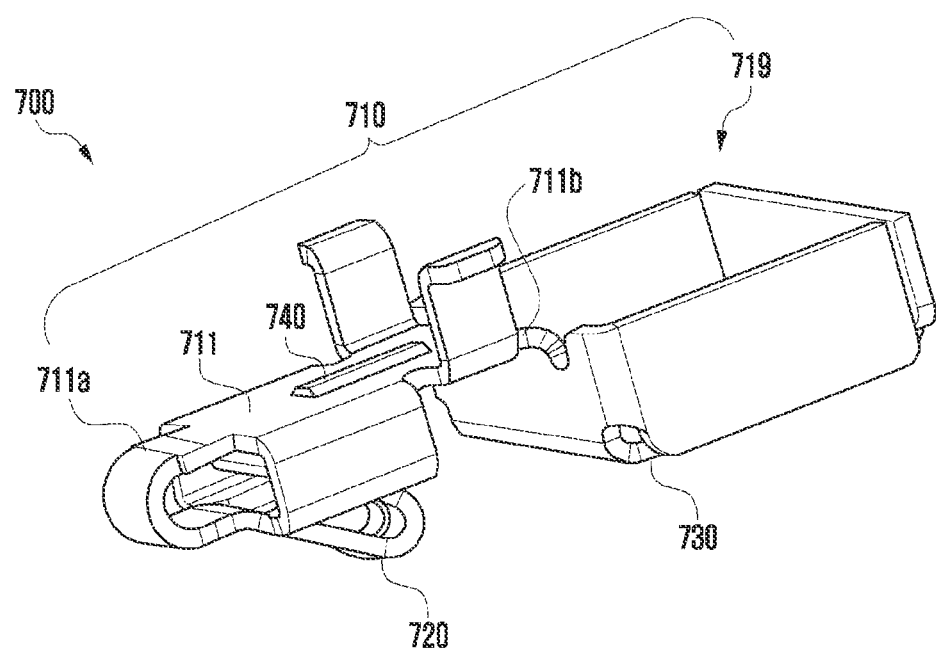
FIGS. 8A and 8B are views illustrating an antenna dip according to another embodiment, at various angles.
Figure 8B:
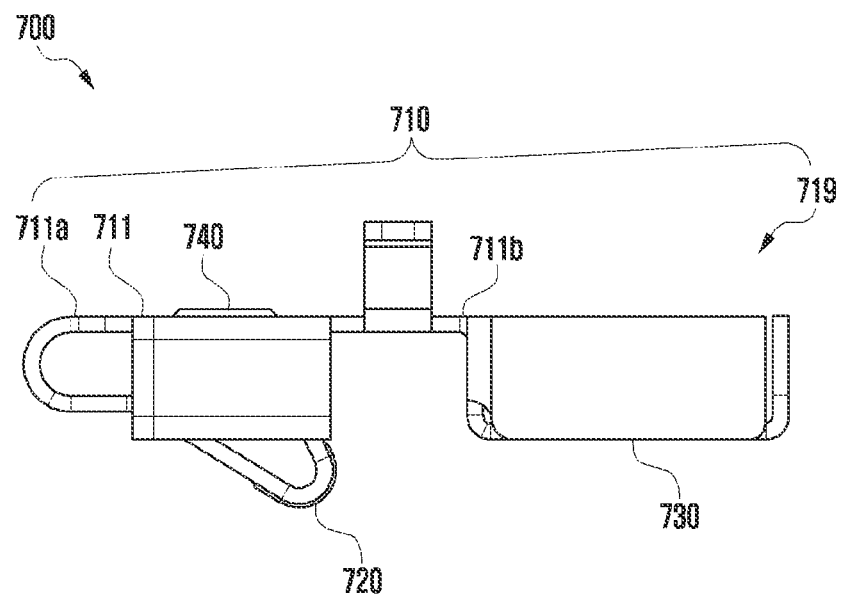

FIGS. 8A and 8B are views illustrating an antenna clip 700 according to another embodiment, at various angles.

FIG. 8A is a perspective view of the antenna clip 700 according to the embodiment of the disclosure, and FIG. 8B is a side view of the antenna clip 700 according to the embodiment of the disclosure.

Referring to FIGS. 8A and 8B, the antenna clip 700 according to the another embodiment of the disclosure may include a coupling body 710 that is to be coupled to the rear housing 420 (see FIG. 5), a first contact portion 720 that is to be electrically connected to the external radiator 430 (see FIG. 5), a second contact portion 730 that is to be electrically connected to the main antenna disposed in the circuit board 440 (see FIG. 5), and a third contact portion 740 that is to be electrically connected to the sub-antenna 431 (see FIG. 4B) of the rear housing.

The coupling body 710 according to the embodiment of the disclosure may include a base plate 711 and a coupling portion 719. The base plate 711 may have a substantially rectangular shape, and coupling portions 719 may be disposed at corners 711a and 711b of a short side.

The coupling portion 719 according to the embodiment of the disclosure may be a box-shaped structure connected to the second direction corner 711b of the base plate 711, and may have a shape having an opened direction surface. That is, an upper side of the coupling portion 719 may have a shape, an upper side of which is opened, with reference to the illustrated state of FIG. 8A or FIG. 8B. The opened surface of the coupling portion 719 may be mounted on the rear housing such that the antenna clip 700 is coupled to the rear housing.

The first contact portion 720 according to the embodiment of the disclosure may extend from the first direction corner 711b of the base plate 711 and be bent in an opposite direction a plurality of times. The first contact portion 720 may be deformed in a direction or an opposite direction to provide an elastic force. For example, the first contact portion 720 may be made to be maintained while contacts points of the first contact portion 520 and the flange 431 (see FIG. 5) are not separated from each other, by applying an elastic force to a contact surface of the first contact portion 520 with the flange 431 (see FIG. 5). Through this, the antenna clip 700 and the external radiator may be electrically connected to each other.

The coupling portion 719 according to the embodiment of the disclosure may have a second contact portion 730, except for a surface of the coupling portion 719, which is coupled to the second direction corner 611b of the base plate 711, and the opened surface of the coupling portion 719.

For example, the second contact portion 730 may be disposed on a first surface, among a plurality of surfaces of the coupling portion 719, and may be disposed on a bottom surface of the coupling portion 719 with reference to FIG. 8A or 8B. Through this, the antenna clip 700 and the main antenna of the circuit board may be electrically connected to each other.

The third contact portion 740 according to the embodiment of the disclosure may be disposed on a surface of the base plate 711, and may be disposed on an upper surface of the base plate 711 with reference to FIG. 8A or 8B. The base plate 711 may contact a sub-antenna pattern of the rear housing through the third contact portion 740, and the antenna clip 700 may be electrically connected to the sub-antenna of the rear housing.

An electronic device 400 according to an embodiment of the disclosure may include a front housing 410 disposed in an interior space of the electronic device 400 and including a display 411 on a front surface of the front housing 410, a rear housing 420 located on a rear surface of the front housing 410, and an antenna clip 500 coupled to the rear housing 420, and the antenna clip 500 may include a coupling body 510 coupled to one end of the rear housing 420, a first contact portion 520 extending from the coupling body 510 and electrically connected to an external radiator 430, and a second contact portion 530 electrically connected to a circuit board 440 disposed between the front housing 410 and the rear housing 420.

A sub-antenna 421 may be disposed in the rear housing 420, and a third contact portion 540 electrically connected to the sub-antenna 421 disposed in the rear housing 420 is disposed at a portion of the coupling body 510.

A main antenna may be disposed in the circuit board 440, and the second contact portion 530 may be electrically connected to the main antenna to electrically connect the external radiator 430 to the main antenna.

The external radiator 430 may be a metal frame surrounding outer peripheries of the front housing 410 and the rear housing 420.

A flange 431 protruding between the rear housing 420 and the circuit board 440 and contacting the first contact portion 520 may be disposed in the external radiator 430.

The coupling body 510 may include a base plate 511 having corners in a first direction and a second direction that is opposite to the first direction, a first plate 513 extending from the first direction corner of the base plate 511 and bent in one direction, and a second plate 515 extending from the first plate 513 and bent to face the base plate 511, and a gap defined by the base plate 511 and the second plate 515 may be smaller than the thickness of the rear housing 420.

The first contact portion 520 may extend from the second direction corner of the base plate 511 and be bent in an opposite direction of the base plate 511 a plurality of times, and may provide an elastic force in the opposite direction of the base plate 511.

The third contact portion 540 may be disposed on a surface of any one of the base plate 511 or the second plate 515, which contacts the rear housing 420, and is electrically connected to the sub-antenna 421 of the rear housing 420.

A coupling hole 517 may be disposed in any one of the base plate 511 or the second plate 515, a coupling boss may be disposed in the rear housing 420, and the coupling hole 517 and the coupling boss may be coupled to each other to couple the antenna clip 500 and the rear housing 420.

The coupling body 510 may include a base plate 511 having corners in a first direction and a second direction that is opposite to the first direction, and a coupling portion connected to the second direction corner of the base plate 511 and having a box shape, one second direction surface of which is opened, and the coupling portion may be coupled to the rear housing 420.

The first contact portion 520 may extend from the first direction corner of the base plate 511 and be bent in an opposite direction of the base plate 511 a plurality of times, and may provide an elastic force in the opposite direction of the base plate 511.

The second contact portion 530 may be disposed on a first surface, among surfaces of the box-shaped coupling portion, except for a surface coupled to the base plate 511 and an opened surface of the coupling portion, to be electrically connected to a main antenna of the circuit board 440.

The third contact portion 540 may be disposed on a second surface of the box-shaped coupling portion to be electrically connected to the sub-antenna 421 of the rear housing 420.

A coupling hole 517 may be disposed on a third surface of the box-shaped coupling portion, a coupling boss may be disposed in the rear housing 420, and the coupling hole 517 and the coupling boss may be coupled to each other to couple the antenna clip 500 and the rear housing 420.

The coupling body 510 may include a base plate 511 having corners in a first direction and a second direction that is opposite to the first direction, and a coupling portion extending from the second direction corner of the base plate 511 and having a box shape, an upper side of which is opened, and the coupling portion is coupled to the rear housing 420.

The first contact portion 520 may extend from the first direction corner of the base plate 511 and be bent in an opposite direction of the base plate 511 a plurality of times, and may provide an elastic force in the opposite direction of the base plate 511.

The second contact portion 530 may be disposed on a first surface, among surfaces of the box-shaped coupling portion, except for a surface coupled to the base plate 511 and an opened surface of the coupling portion, to be electrically connected to a main antenna of the circuit board.

The third contact portion 540 may be disposed in the base plate 511 to be electrically connected to the sub-antenna 421 of the rear housing 420.

An antenna clip 500 according to an embodiment of the disclosure may include a coupling body 510 coupled to one end of a rear housing 420 of an electronic device 400, a first contact portion 520 extending from the coupling body 510 and electrically connected to an external radiator 430, a second contact portion 530 electrically connected to a circuit board 440 disposed between the front housing 410 of the electronic device 400 and the rear housing 420, and a third contact portion 540 disposed at a portion of the coupling body 510 and electrically connected to the rear housing 420.

The external radiator 430 may be a metal frame surrounding an outer periphery of the electronic device 400, a main antenna may be disposed in the circuit board 440 to be electrically connected to the second contact portion 530, and a sub-antenna 421 may be disposed in the rear housing 420 to be electrically connected to the third contact portion 540.

The invention claimed is:

1. An electronic device comprising:
a front housing disposed in an interior space of the electronic device;
a display disposed on a front surface of the front housing;
a rear housing located on a rear surface of the front housing; and
an antenna clip coupled to the rear housing,
wherein the antenna clip comprises:
a coupling body coupled to one end of the rear housing;
a first contact portion extending from the coupling body and electrically connected to an external radiator disposed on outer peripheries of the electronic device so as to be visible from an outside of the electronic device; and
a second contact portion electrically connected to a circuit board disposed between the front housing and the rear housing.

2. The electronic device of claim 1, wherein a sub-antenna is disposed in the rear housing, and a third contact portion electrically connected to the sub-antenna disposed in the rear housing is disposed at a portion of the coupling body.

3. The electronic device of claim 2, wherein the coupling body comprises:
a base plate having corners in a first direction and a second direction that is opposite to the first direction;
a first plate extending from the first direction corner of the base plate and bent in one direction; and
a second plate extending from the first plate and bent to face the base plate, and
wherein a gap defined by the base plate and the second plate is smaller than the thickness of the rear housing.

4. The electronic device of claim 3, wherein the first contact portion extends from the second direction corner of the base plate and is bent in an opposite direction of the base plate a plurality of times, and provides an elastic force in the opposite direction of the base plate.

5. The electronic device of claim 3, wherein the third contact portion is disposed on a surface of any one of the base plate or the second plate, which contacts the rear housing, and is electrically connected to the sub-antenna of the rear housing.

6. The electronic device of claim 3, wherein a coupling hole is disposed in any one of the base plate or the second plate, a coupling boss is disposed in the rear housing, and the coupling hole and the coupling boss are coupled to each other to couple the antenna clip and the rear housing.

7. The electronic device of claim 2, wherein the coupling body comprises:
 a base plate having corners in a first direction and a second direction that is opposite to the first direction; and
 a coupling portion connected to the second direction corner of the base plate and having a box shape, one second direction surface of which is opened, and
 wherein the coupling portion is coupled to the rear housing.

8. The electronic device of claim 7, wherein the first contact portion extends from the first direction corner of the base plate and is bent in a direction opposite to the base plate a plurality of times, and provides an elastic force in the opposite direction of the base plate.

9. The electronic device of claim 7, wherein the second contact portion is disposed on a first surface, among surfaces of the box-shaped coupling portion, except for a surface coupled to the base plate and an opened surface of the coupling portion, to be electrically connected to a main antenna of the circuit board.

10. The electronic device of claim 9, wherein the third contact portion is disposed on a second surface of the box-shaped coupling portion to be electrically connected to the sub-antenna of the rear housing.

11. The electronic device of claim 10, wherein a coupling hole is disposed on a third surface of the box-shaped coupling portion, a coupling boss is disposed in the rear housing, and the coupling hole and the coupling boss are coupled to each other to couple the antenna clip and the rear housing.

12. The electronic device of claim 2, wherein the coupling body comprises:
 a base plate having corners in a first direction and a second direction that is opposite to the first direction; and
 a coupling portion connected to the second direction corner of the base plate and having a box shape, an upper side of which is opened, and
 wherein the coupling portion is coupled to the rear housing.

13. The electronic device of claim 12, wherein the first contact portion extends from the first direction corner of the base plate and is bent in a direction opposite to the base plate a plurality of times, and provides an elastic force in the opposite direction of the base plate.

14. The electronic device of claim 12, wherein the second contact portion is disposed on a first surface, among surfaces of the box-shaped coupling portion, except for a surface coupled to the base plate and an opened surface of the coupling portion, to be electrically connected to a main antenna of the circuit board.

15. The electronic device of claim 14, wherein the third contact portion is disposed in the base plate to be electrically connected to the sub-antenna of the rear housing.

16. The electronic device of claim 1, wherein a main antenna is disposed in the circuit board, and the second contact portion is electrically connected to the main antenna to electrically connect the external radiator to the main antenna.

17. The electronic device of claim 16, wherein the external radiator is a metal frame surrounding the outer peripheries of the front housing and the rear housing.

18. The electronic device of claim 17, wherein a flange protruding between the rear housing and the circuit board and contacting the first contact portion is disposed in the external radiator.

19. An antenna clip comprising:
 a coupling body coupled to one end of a rear housing of an electronic device;
 a first contact portion extending from the coupling body and electrically connected to an external radiator disposed on an outer periphery of the electronic device so as to be visible from an outside of the electronic device;
 a second contact portion electrically connected to a circuit board disposed between a front housing of the electronic device and the rear housing; and
 a third contact portion disposed at a portion of the coupling body and electrically connected to the rear housing.

20. The antenna clip of claim 19, wherein the external radiator is a metal frame surrounding the outer periphery of the electronic device, a main antenna is disposed in the circuit board to be electrically connected to the second contact portion, and a sub-antenna is disposed in the rear housing to be electrically connected to the third contact portion.

* * * * *